(12) United States Patent
Fong (10) Patent No.: US 7,165,857 B2
(45) Date of Patent: Jan. 23, 2007

(54) INTERACTIVE LED DISPLAY DEVICE

(76) Inventor: Peter Sui Lun Fong, 297F South Atlantic Blvd., Monterey Park, CA (US) 91754

( * ) Notice: Subject to any disclaimer, the term of this patent is extended or adjusted under 35 U.S.C. 154(b) by 125 days.

(21) Appl. No.: 11/028,401

(22) Filed: Jan. 3, 2005

(65) Prior Publication Data

US 2005/0141236 A1   Jun. 30, 2005

Related U.S. Application Data

(63) Continuation-in-part of application No. 10/365,112, filed on Feb. 12, 2003, now Pat. No. 6,851,999, and a continuation-in-part of application No. 10/264,797, filed on Oct. 4, 2002, now Pat. No. 6,997,772.

(51) Int. Cl.
*F21V 21/30* (2006.01)

(52) U.S. Cl. .................. 362/35; 362/272; 362/286; 340/815.45

(58) Field of Classification Search ........... 362/35, 362/269, 286, 272, 86, 233; 446/175, 236, 446/242, 243, 219; 315/312; 340/815.4, 340/815.45
See application file for complete search history.

(56) References Cited

U.S. PATENT DOCUMENTS 4,338,547 A * 7/1982 McCaslin .................. 315/312
5,300,864 A    4/1994  Allen, Jr.
5,356,328 A * 10/1994 Ho ............................ 446/242
5,387,146 A *  2/1995 Smith et al. ................ 446/175
5,791,966 A *  8/1998 Capps et al. ............... 446/242
6,265,984 B1   7/2001  Molinaroli
6,361,198 B1   3/2002  Reed
6,424,096 B1   7/2002  Lowe et al.
6,802,755 B1* 10/2004 Walker et al. .............. 446/175
6,991,511 B1*  1/2006 Maggiore et al. ........... 446/330
7,033,035 B1*  4/2006 Fatemi et al. ................ 362/35
2001/0028227 A1 10/2001 Lys et al.
2003/0137258 A1  7/2003 Piepgrass et al.
2003/0213045 A1 11/2003 Fuentes

* cited by examiner

*Primary Examiner*—Renee Luebke
*Assistant Examiner*—Gunyoung T. Lee
(74) *Attorney, Agent, or Firm*—Stetina Brunda Garred & Brucker (57) ABSTRACT

A toy, particularly an educational toy that has a light-emitting diode device attached thereto. Instead of a whole array of light-emitting diodes, the light-emitting diode device has only one or multiple cross rows of light-emitting diodes rotating about an axis. The light-emitting diode device is operative to generate a plurality of illumination patterns or images by selectively switching on/off the light-emitting diodes at a specific orientation. The light-emitting diode device further has a sound-generating device interactive with the light-emitting diodes. That is, the sound-generating device is operative to generate a sound to represent an audio form of the illumination patterns or images displayed by the light-emitting diodes.

26 Claims, 11 Drawing Sheets

INTERACTIVE LED DISPLAY DEVICE

CROSS-REFERENCE TO RELATED APPLICATIONS

This application is a continuation-in-part of U.S. patent application Ser. No. 10/264,797 entitled INTERACTIVE DEVICE LED DISPLAY filed Oct. 4, 2002 now U.S. Pat. No. 6,997,772 and U.S. patent application Ser. No. 10/365,112 entitled INTERACTIVE LED DEVICE filed Feb. 12, 2003 now U.S. Pat. No. 6,851,999, which are incorporated by reference herewith.

STATEMENT RE: FEDERALLY SPONSORED RESEARCH/DEVELOPMENT

Not Applicable

BACKGROUND OF THE INVENTION

The present invention relates in general to a light-emitting diode (LED) display, and more particular, to a light-emitting diode device including a sound-generating portion and a sound-generating system interactive with each other.

Light-emitting diode devices having various sizes and display effects have been developed and are available in the market. Depending on the complexity of required illumination pattern, most of the light-emitting diode devices include arrays of light-emitting diodes selectively switched on/off to generate such illumination pattern. When a complex illumination pattern is desired, the number of required light-emitting diodes can be significant. In addition, when the light-emitting diode devices are applied to an educational toy, the educational value is limited to the image only.

BRIEF SUMMARY OF THE INVENTION

The present invention provides a toy, particularly an educational toy that includes a light-emitting diode device attached thereto. Instead of a multiple-row and/or multiple-column array of light-emitting diodes, the light-emitting diode device includes only a single row or cross rows of light-emitting diodes rotating about an axis. The light-emitting diode device is operative to generate a plurality of illumination patterns or images by selectively switching on/off the light-emitting diodes at a specific orientation. The light-emitting diode device further comprises a sound-generating device interactive with the light-emitting diodes. That is, the sound-generating device is operative to generate a sound to represent an audio form of the illumination patterns or images displayed by the light-emitting diodes.

The light-emitting diode device as provided comprises a housing with a clear front cover, at least one row of light-emitting diodes, and a speaker. The row of light-emitting diodes is mounted on a light-emitting diode printed circuit board, on which a first transmitter and a first receiver are mounted. A spinning mechanism is also installed in the housing for driving the row of light-emitting diodes to rotate. The sound-generating device includes a speaker electrically connected to a main printed-circuit board. A second transmitter and a second receiver are mounted to the main printed circuit board. Preferably, infrared communication is used between the first and second transmitters and receivers. When an illumination pattern is generated by the light-emitting diodes, an activation signal is transmitted from the first transmitter to the second receiver, such that the speaker is activated to generate a sound coordinating the illumination pattern. The sound and the illumination pattern can be generated synchronously or in a predetermined time sequence. The light-emitting diodes can also be activated by an activation signal transmitted from the second transmitter to the first receiver.

The housing of the light-emitting diode can be in various forms, including a circular dish, a rectangular prism or cube. The front cover is fabricated from clear material such that illumination patterns or images generated by the light-emitting diodes can be easily observed through the front cover. Preferably, a divider such as a supporting frame or an internal frame is installed in the housing to divide the light-emitting diodes and the sound-generating devices. To obtain a uniform brightness of the illumination pattern, a spacer for supporting the light-emitting diodes is configured to ensure a substantially identical length of optical path for the light-emitting diodes.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
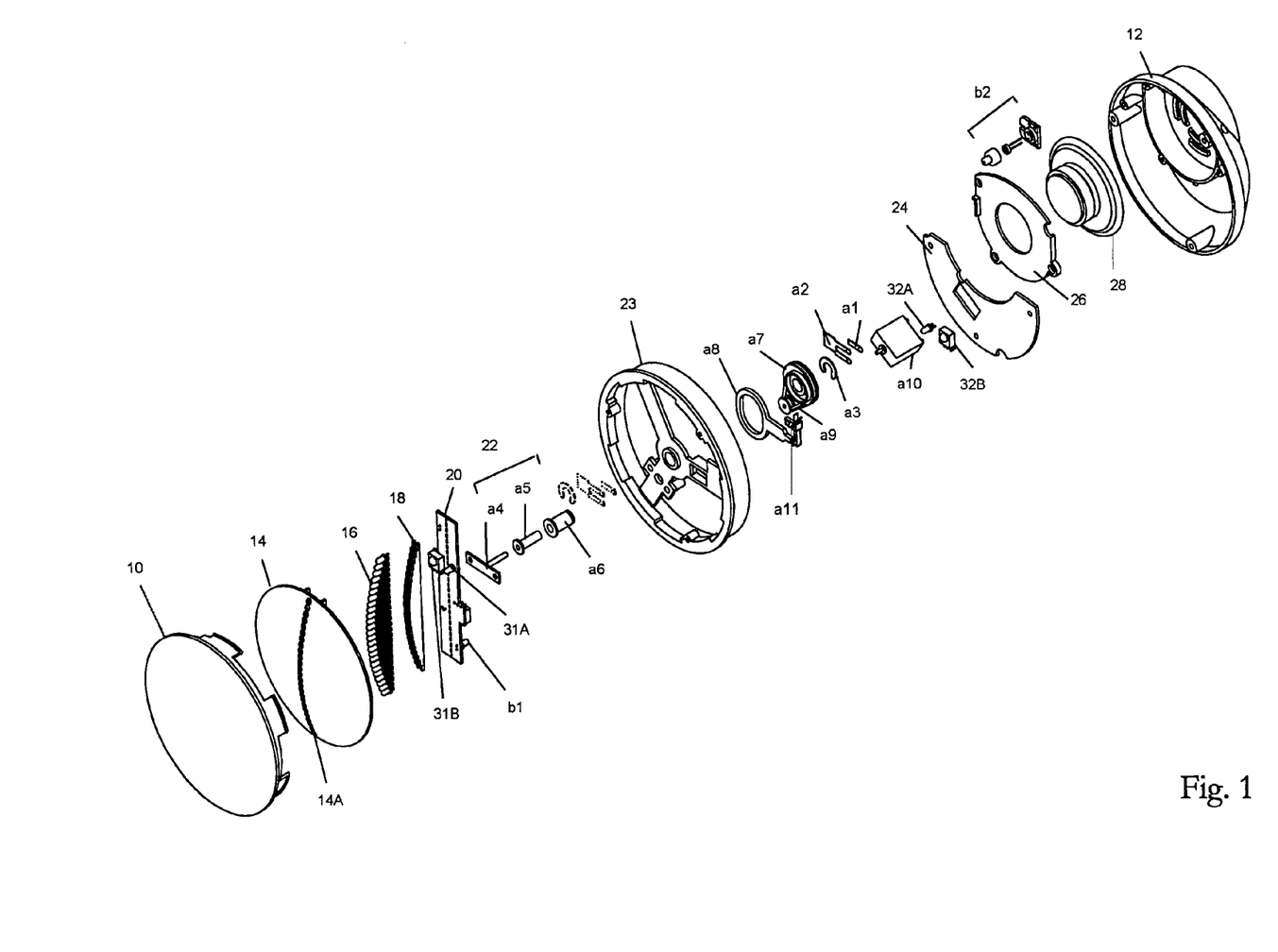
FIG. 1 is an exploded view showing a first embodiment of a light-emitting diode device.
Figure 2:
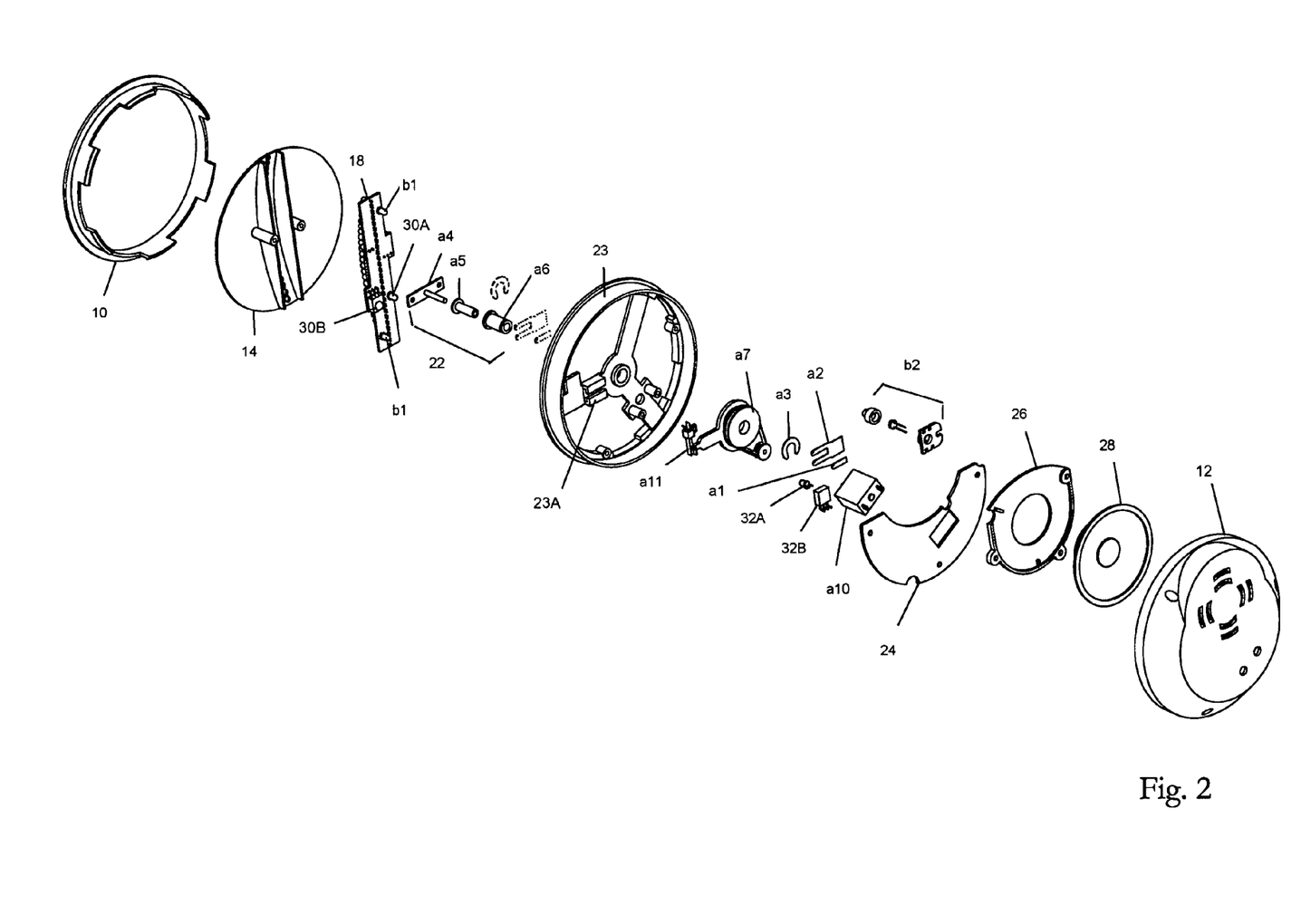
FIG. 2 is an exploded view of the first embodiment of the light-emitting diode device observing from another direction.
Figure 3:
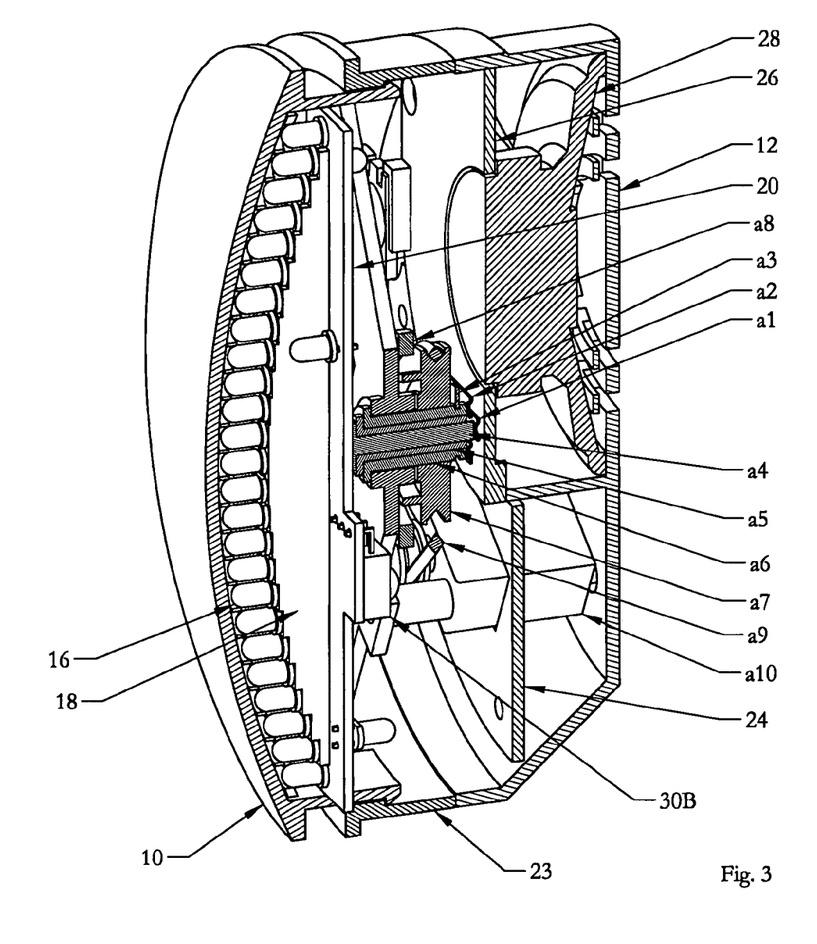
FIG. 3 is a cutaway view of the light-emitting diode device as shown in FIGS. 1 and 2.
Figure 4:
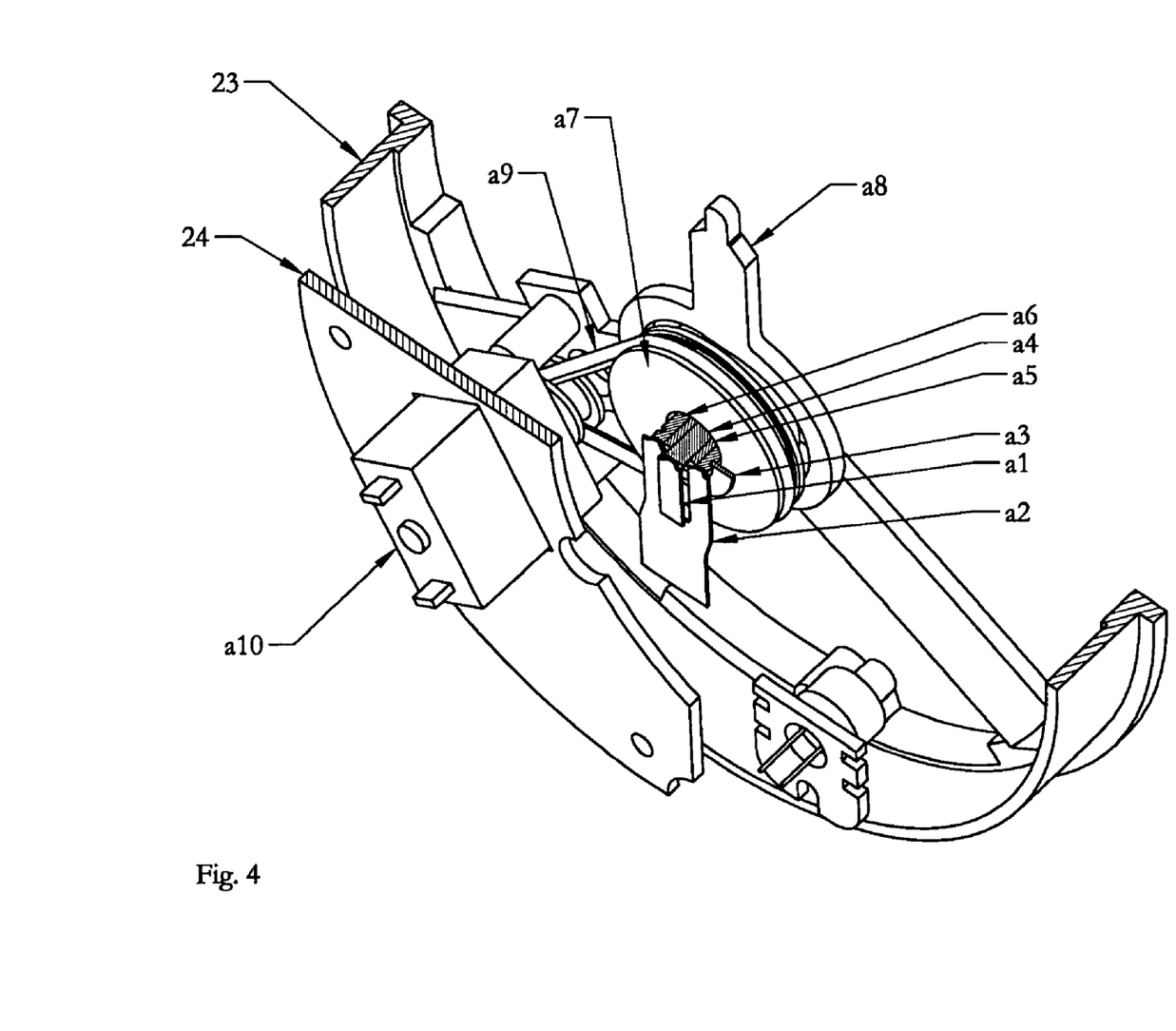
FIG. 4 is shows a local enlargement of the light-emitting diode device as shown in FIGS. 1–3.

Referring now to the drawings wherein the showings are for purposes of illustrating a preferred embodiment of the present invention only, and not for purpose of limiting the same. FIGS. 1 and 2 show exploded view of a first embodiment of a light-emitting diode device, FIG. 3 shows a cutaway view of the light-emitting diode device as shown in FIGS. 1 and 2, and FIG. 4 shows a local enlargement of the light-emitting diode device as shown in FIGS. 1–3. In the first embodiment, the light-emitting diode device includes a light-generating portion operative to generate an image or an illumination pattern and a sound-generating portion operative to generate a sound coordinated with the image or illumination pattern. Preferably, the light-generating portion and sound-generating portion are coordinated with each other such that the image and the sound can be generated synchronously or in a preferred time sequence. As shown in FIGS. 1–3, the light-emitting diode device is in the form of a circular dish that has a front cover 10, a rear cover 12, and a supporting frame 23 between the front cover 10 and the rear cover 12. Preferably, the supporting frame 23 is attached to the rear cover 12 by fastening members such as screws at the peripheries thereof, and the front cover 10 is then tightly fitted to the supporting frame 23. The supporting frame 23 between the front cover 10 and the rear cover 12 partitions the light-emitting diode device into a front compartment and a rear compartment. In this embodiment, the light-generating portion of the light-emitting diode device is installed in the front compartment and comprises a light-emitting diode guide 14, at least one row of light-emitting diodes 16, a spacer 18, and a printed circuit board 20, while the sound-generating portion is installed in the rear compartment and includes another printed circuit board 24, a divider plate 26, and a speaker 28. The light-emitting diode device further comprises a spinning mechanism that includes a shaft member 22 extending through the supporting frame 23 for rotating the printed circuit board 20 and the light-emitting diodes 16. The spinning mechanism will be further described later in this specification.

The front cover 10 is preferably fabricated from a clear material such that light and illumination pattern generated by the light-emitting diodes 16 can be easily observed from outside of the light emitting diode device. In this embodiment, both the front cover 10 and the light-emitting diode guide 14 are configured with curved surfaces each having a gradually protruding center. The light-emitting diode guide 14 can be fabricated from metal or other materials such as plastic. The light-emitting diode guide 14 can be formed with a row of perforations 14A allowing the light-emitting diodes 16 aligned therewith and inserted therein, such that light emitted from the light-emitting diodes 16 can propagate through the light-emitting diode guide 14. However, when the light-emitting diode guide 14 is fabricated from material that has insufficient ductility, the perforations 14A is easily to cause breakage. Therefore, when the light-emitting diode guide 14 is fabricated from material such as plastic or the like, the light-emitting diode guide 14 may be coated by paint or ink opaque to the light generated by the light-emitting diodes 16, while leaving a plurality of transparent windows allowing the light-emitting diodes 16 to emit light through. The spacer 18 for supporting the light-emitting diodes 16 is configured with a plurality of steps at various heights to ensure a substantially identical length of optical path for the light emitted from each of the light-emitting diodes 16. The substantially identical length of optical path between the light-emitting diodes 16 and the front cover 10 results in a uniform brightness of light emitted from the light-emitting diodes 16. As shown, the spacer 18 has an arc top surface for mounting the light-emitting diodes 16 and a flat bottom surface to be mounted on a first surface of the printed circuit board 20. In this embodiment, the terminals of the light-emitting diodes 16 extend through the spacer 18 to electrically connect to the printed circuit board 20.

The printed circuit board 20 includes a microprocessor (not shown) selectively switching on/off the light-emitting diode 16 at various orientations. A second surface of the printed circuit board 20 is attached to the spinning mechanism of which the spinning pattern is controlled by the microprocessor mounted on the printed circuit board 20. By accurately timing the on/off status and spinning motion of the light-emitting diodes 18, a plurality of illumination patterns such as a moving letter or message, symbol, number and multi-color graphic can be generated.

As mentioned above, the light-emitting diode device further comprises a spinning mechanism for driving the light-emitting diodes 16 to rotate. As shown in FIG. 1, the spinning mechanism includes a shaft member 22 comprised of a conductive shaft a4, an insulating bushing a5 and a conductive bushing a6 tightly fitted together for rotating the printed circuit board 20 as well as the light-emitting diodes 16. The shaft member 22 extends through the supporting frame 23, and the spinning mechanism further includes a cam member a7 in the rear compartment for actuating the spinning motion of the shaft member 22. The cam member a7 is preferably an eccentric cam with a rubber belt a9 driven by a motor a10 for generating the rotation thereof. A cam follower a8 is preferably installed between the cam member a7 and the supporting frame 23 to follow the rotating motion of the cam member a7. The cam follower a8 includes an arm movably inserted into a slot 23A formed at a rear surface of the supporting frame 23 for actuating a leaf switch a11 mounted to either the housing or the printed circuit board 24, such that the leaf switch a11 is intermittently switched on and off by the actuation of the cam follower a8. The on/off operation of the leaf switch a11 can be used for counting the number of rotations or the spinning rate of the light-emitting diodes 16 as well as determining orientation of the light-emitting diodes 16. In addition to the leaf switch a11 that mechanically counts the spinning rate and detects the position of the light-emitting diodes 16, other devices such as a signal transmitter and receiver can also be used for providing the spinning rate and the position of the light-emitting diodes 16 optically or electronically. For example, as shown in FIGS. 1 and 2, two signal generators b1, which include two light-emitting diodes in this embodiment, may be attached to the rear surface of the printed circuit board 20 in the front compartment, and a signal receiver b2, which includes a light sensor in this embodiment, is disposed in the rear compartment. The light sensor b2 includes a sensor element encapsulated within a cap and a back plate as shown in FIG. 2. Both the cap and the back plate are opaque to avoid ambient stray light received by the sensor element. The tip of the cap is transparent to the signal generated from the signal transmitter b1, a signal will be detected only when the signal generator b1 is aligned with the signal receiver b2. For each 360° rotation of the light-emitting diodes 16 or the printed circuit board 20, the light sensor b2 will be aligned with each of the light-emitting diodes b1 once. As a result, two signals will be detected for each 360° rotation. It will be appreciated that the light-emitting diodes b1 are symmetrically disposed at two ends of the printed circuit board 20 to avoid unbalanced weight that tilts the printed circuit board 20. One of the light-emitting diodes b1 may be removed or switched off all the time for accurately counting the spinning rate and determining the orientation of the light-emitting diodes 16. Further, the optical/electronic signal transmitter and receiver b1 and b2, and the cam follower a8 and the leaf switch a11 may be used simultaneously to ensure the accuracy of the orientation and spinning rate of the light-emitting diodes 16.

Referring to FIG. 4, the spinning mechanism further comprises a retainer a3 for binding the tightly fitted conductive shaft a4, the insulating bushing a5 and the conductive busing a6 with the cam follower a8 and the cam a7. At the rear compartment, contact plates a1 and a2 are provided in contact with the conductive shaft a4 and the conductive bushing a6, respectively. The contact plates a1 and a2 are connected to the electric terminals DC power source for supplying power to the printed circuit board 20 and the light-emitting diodes 16 through the conductive shaft a4 and the bushing a6.

The timing and duration for the spinning motion of the spinning mechanism can be preprogrammed and saved in a memory of the microprocessor mounted on the printed circuit board 20 and/or the printed circuit board 24. The microprocessor is then operative to retrieve the information stored in the memory in response to an activation signal.

The second printed circuit board 24 also comprises a microprocessor for controlling the generation of sound. Similarly, a memory of the microprocessor mounted on the printed circuit board 24 may be used for storing a plurality of preprogrammed sounds. Referring to FIG. 2, the light-emitting diode device further comprises a first transmitter 30A and a first receiver 30B mounted to the second surface of the printed circuit board 20 and a second transmitter 32A and a second receiver 32B mounted to a first surface of the second printed circuit board 24. The first transmitter 30A is operative to transmit a signal to the second receiver 32B and the first receiver 30B is operative to receive a signal transmitted from the second transmitter 32A. Therefore, when the microprocessor of the first printed circuit board 20 generates a signal for activating the light-emitting diodes 16, a signal carrying the information of image or illumination pattern to be displayed by the light-emitting diodes 16 is also transmitted to the microprocessor of the second printed circuit board 24 via the first transmitter 30A and the second receiver 32B. An activation signal may then be generated by the second microprocessor to activate the speaker 28, so as to generate a sound corresponding to the image displayed by the light-emitting diodes 16. Similarly, the microprocessor on the second printed circuit board 24 may also generate an activation signal transmitted from the second transmitter 32A to the first received 30B. Upon receiving the activation signal, the light-emitting diodes 16 may be activated to display an image or an illumination pattern corresponding to a sound generated by the speaker 28.

Figure 5:
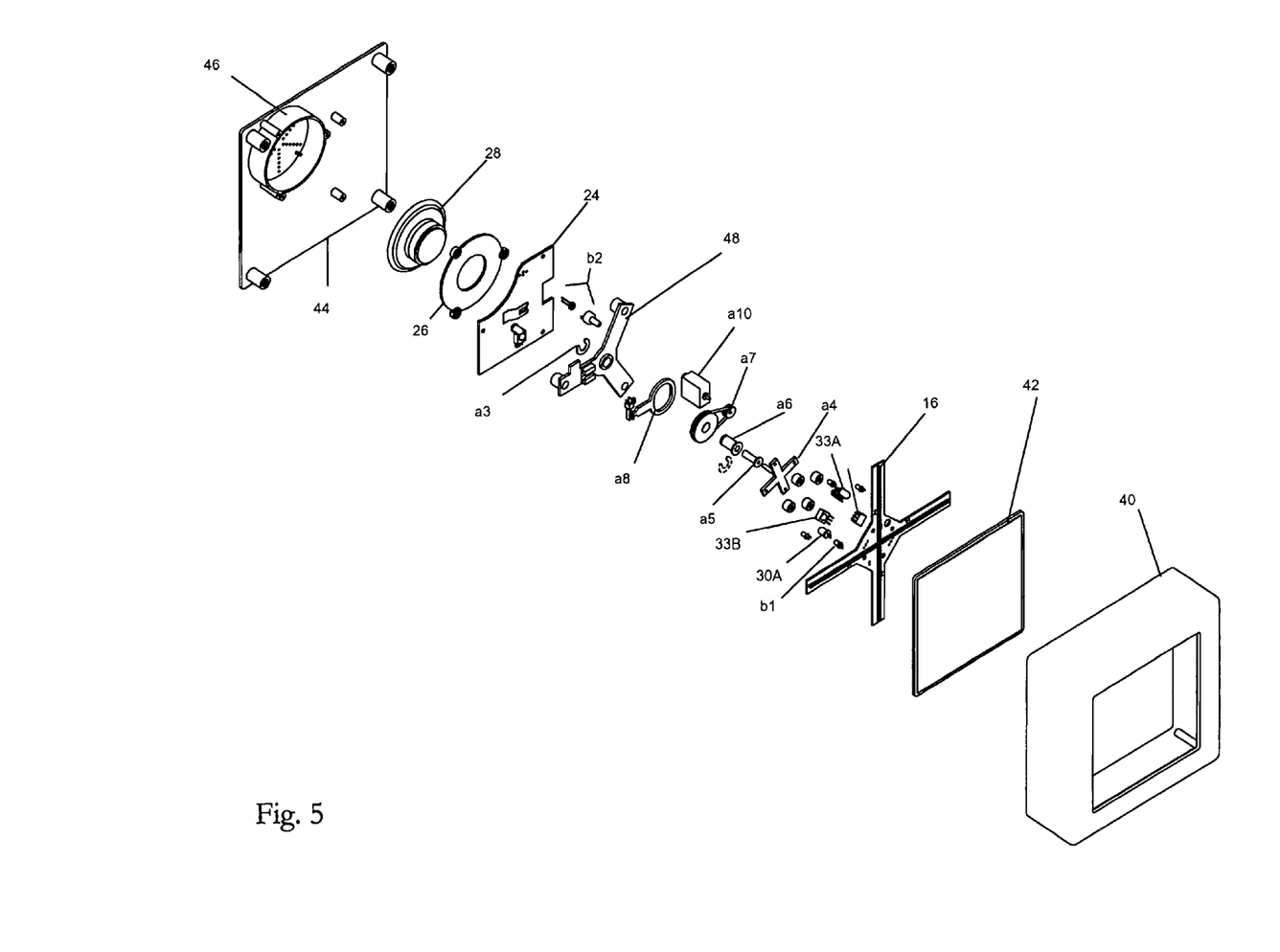
FIG. 5 is an exploded view showing a second embodiment of a light-emitting diode device.
Figure 6:
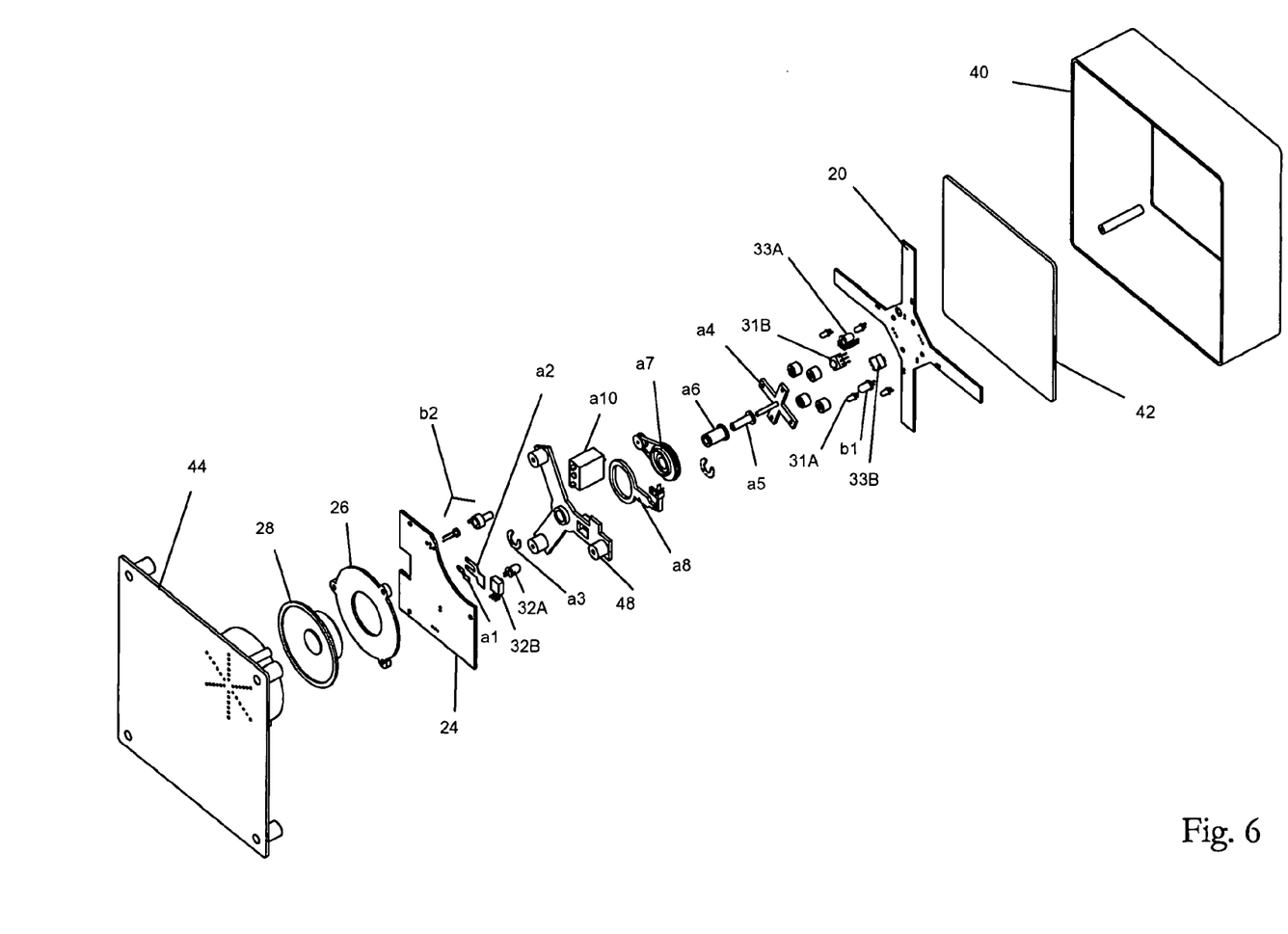
FIG. 6 is an exploded view showing the second embodiment from another direction.
Figure 7:
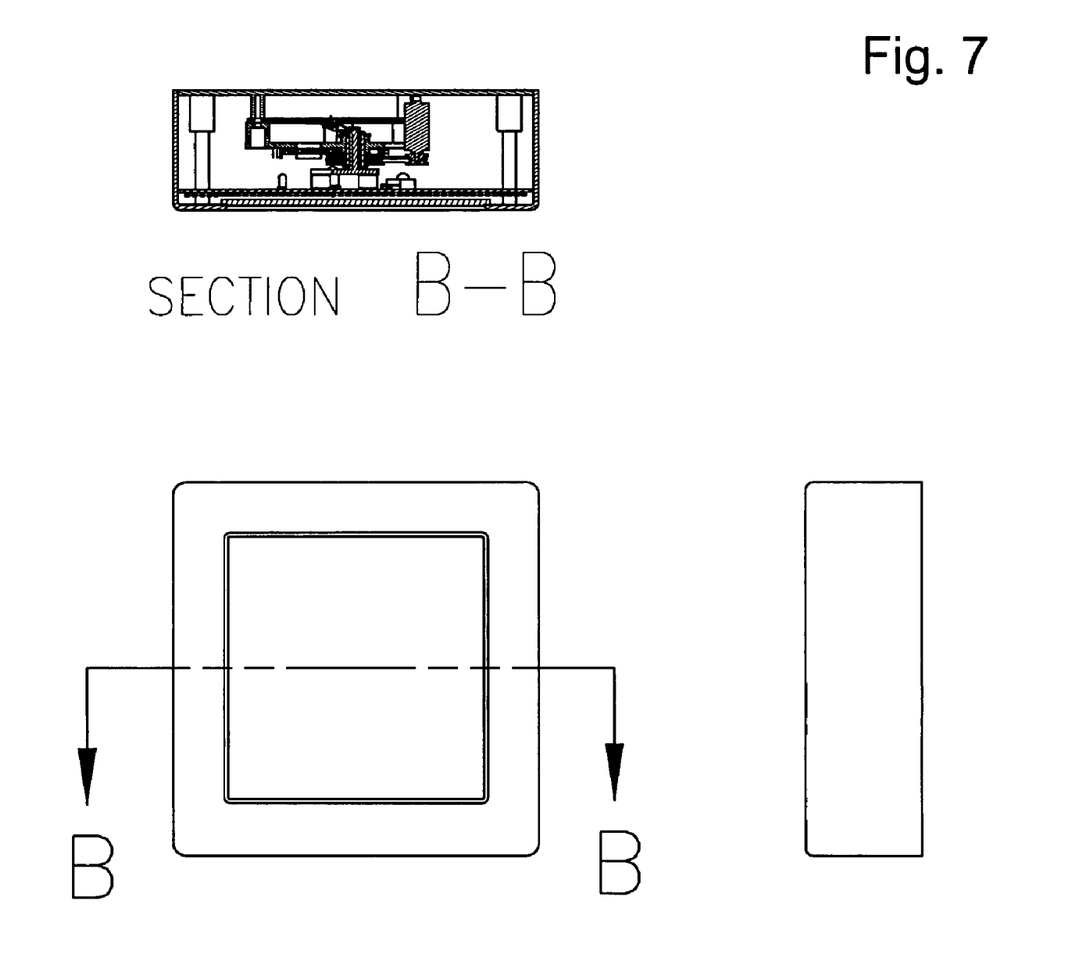
FIG. 7 is a cross sectional view of the second embodiment.
Figure 8:
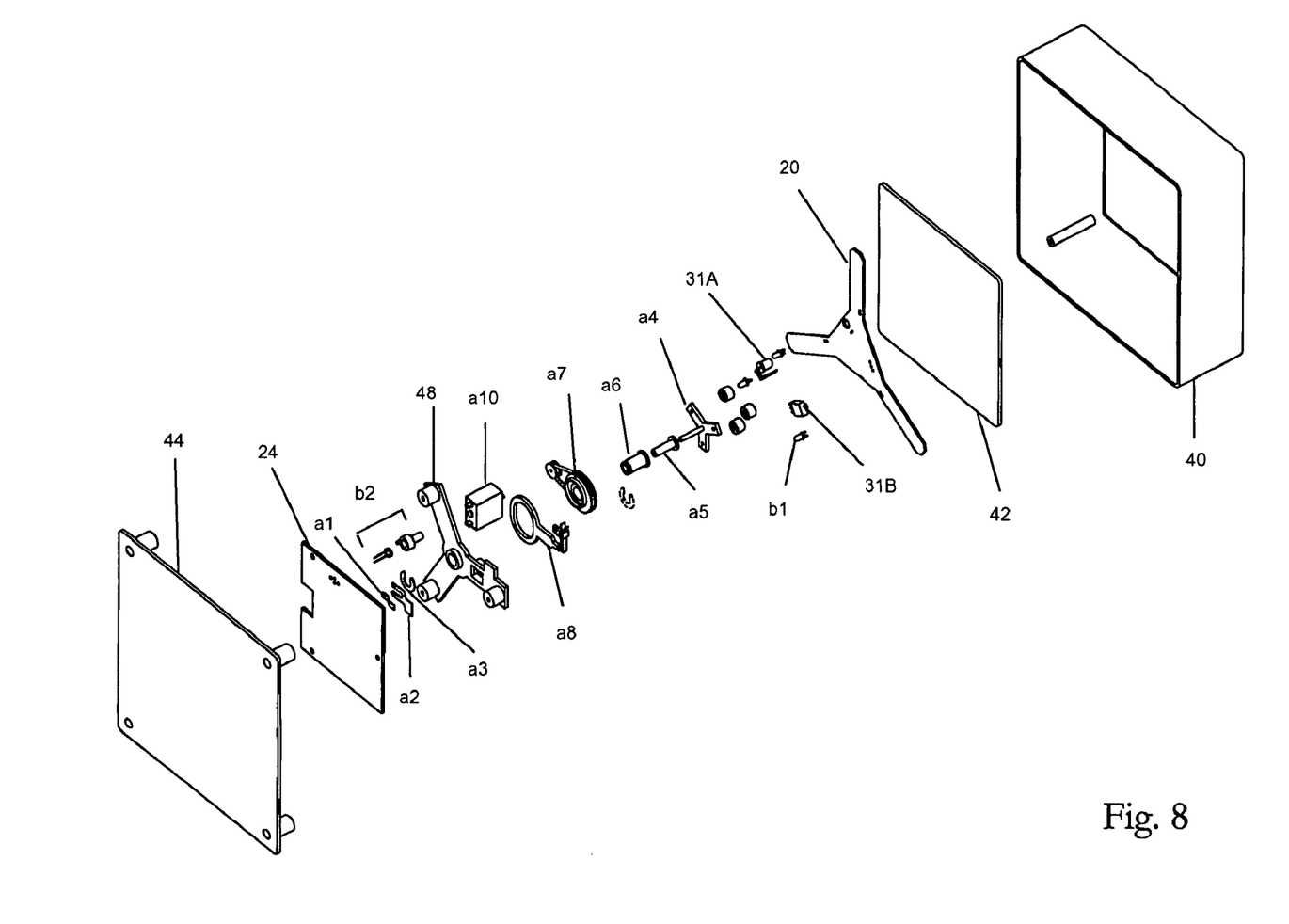
FIG. 8 is an exploded view of a light-generating portion of a light-emitting diode device in a third embodiment of the invention.
Figure 9:
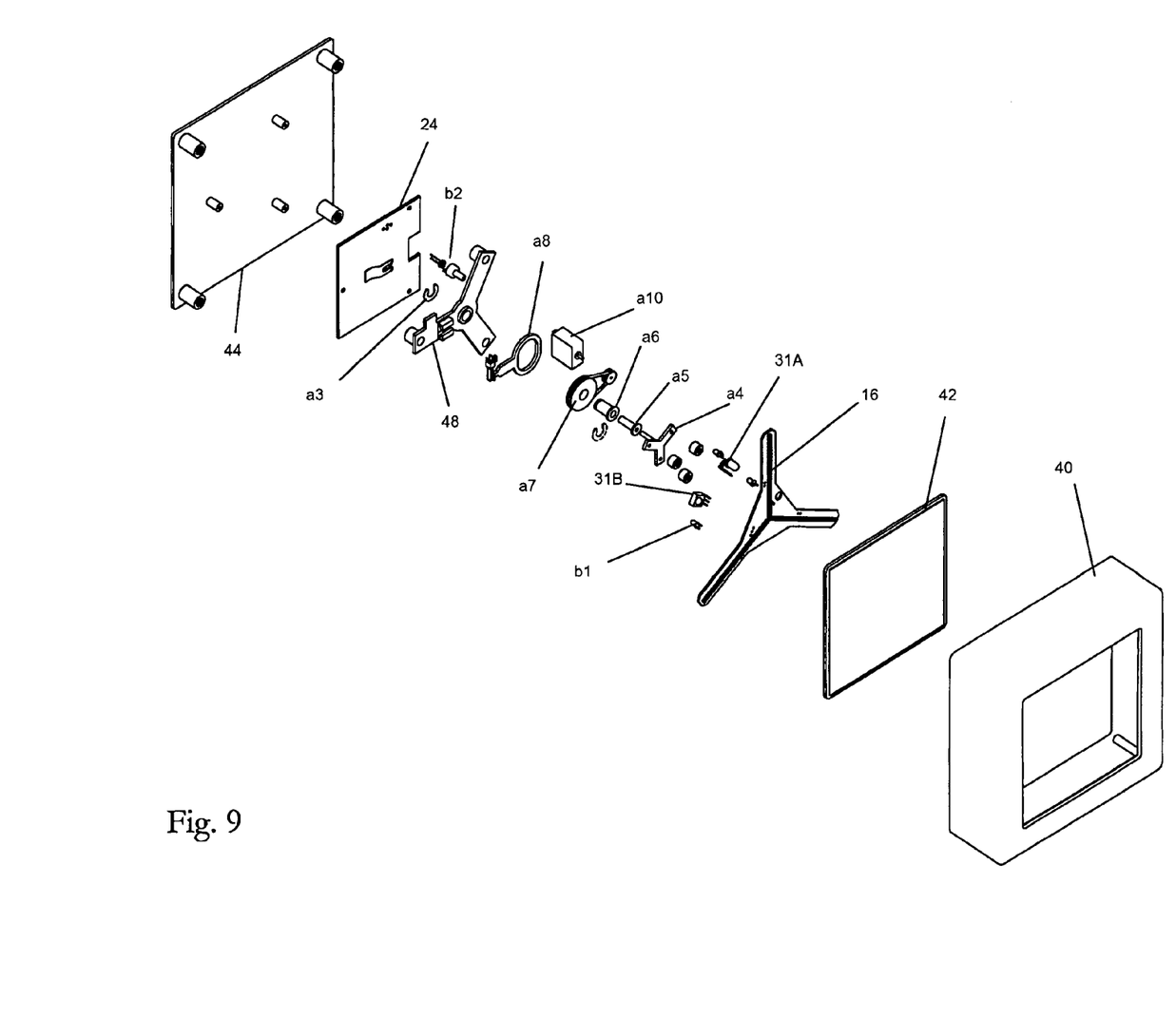
FIG. 9 is an exploded view of the light-generating portion observing from another direction.
Figure 10:
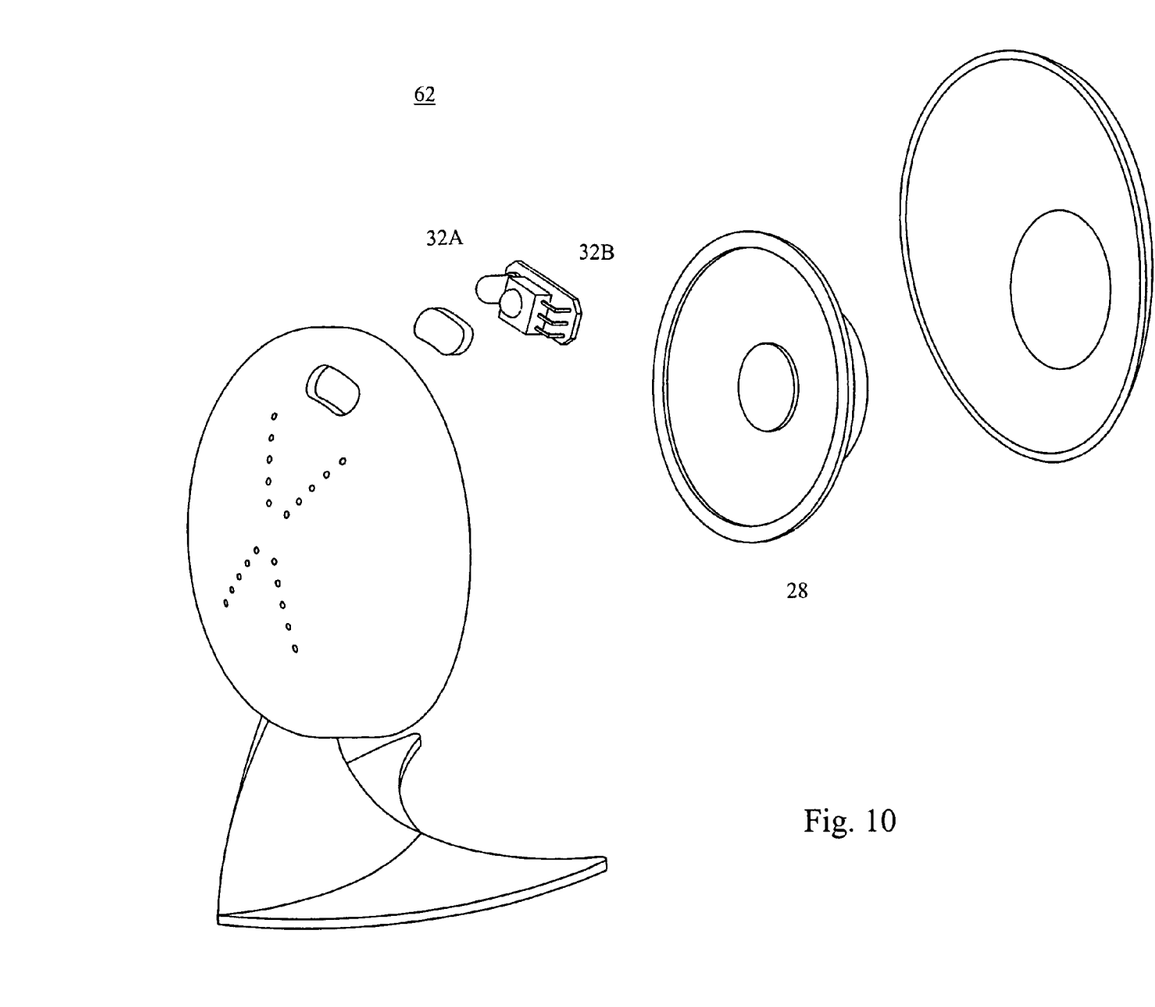
FIG. 10 is an exploded view of a sound-generating portion of the light-emitting diode device.
Figure 11:
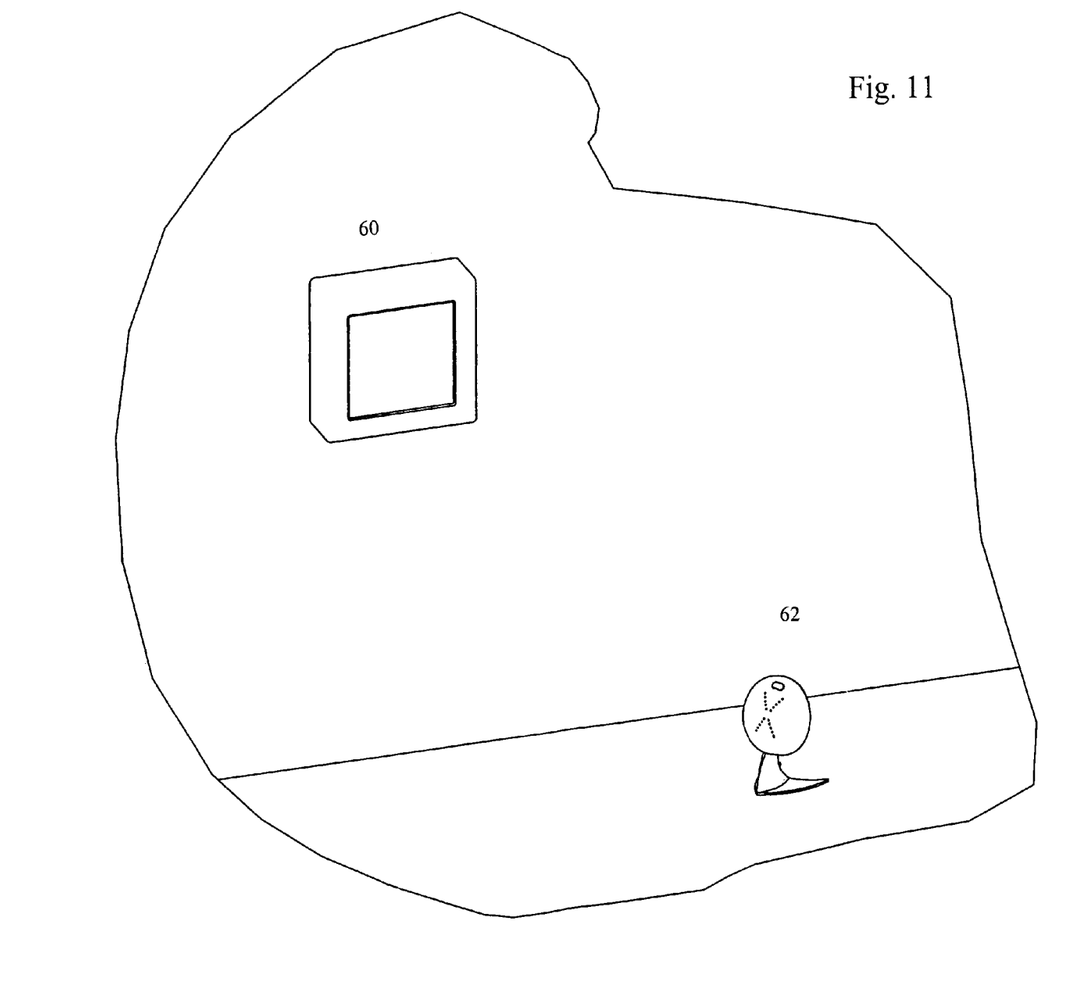
FIG. 11 shows a perspective view of the third embodiment of light-emitting diode device.

FIGS. 5–7 show a second embodiment of a light-emitting diode device. Similar to the first embodiment, the light-emitting diode device includes a light-generating portion and a sound generating portion installed in a housing. In this embodiment, the housing is in the form of a table-top or wall-hanging rectangular unit that includes an enclosure 40, a clear front panel 42 and a rear panel 44. A compartment 46 is formed at a corner portion on the rear panel 44 for receiving the sound-generating portion therein, and an inner frame 48 is mounted to the rear panel 44 for supporting the light-generating portion thereon. The structures and components of the sound- and light-generating portions of the light-emitting diode device are similar to that as discussed in the first embodiment apart from that the light-generating portion in the second embodiment includes two rows of light-emitting diodes 16 arranged as a cross. The light-emitting diodes 16 are rotatable about the center of the printed circuit board 20, that is, the intersection of these two rows of light-emitting diodes 16. In this embodiment, as the front cover 42 is a clear flat panel, the light-emitting diode guide and the spacer are not required. The spinning mechanism, including the shaft member 22, the cam a7, and the motor a10 are installed between the inner frame 48 and the printed circuit board 20.

FIGS. 8–11 show a third embodiment of a light-emitting diode device which includes a light-generating portion and a sound-generating portion interactive with each other. Different from the second embodiment, the light-generating portion 60 and the sound-generating portion 62 are installed at different housings. In addition, three rows of light-emitting diodes 16 are joined at a common center and spinning thereabout. When the light-generating portion 60 and the sound-generating portion 62 are located within an effective range of the transmitters and receivers 31A, 31B, 32A, 32B, the light-generating portion 60 and the sound-generating portion 62 can interact with each other to generate corresponding illumination patterns and sounds simultaneously or in a preferred sequence.

The above description is given by way of example, and not limitation. Given the above disclosure, one skilled in the art could devise variations that are within the scope and spirit of the invention. Further, the various features of this invention can be used along, or in varying combinations with each other and are not intended to be limited to the specific combination described herein. Thus, the invention is not to be limited by the illustrated embodiments but is to be defined by the following claims when read in the broadest reasonable manner to preserve the validity of the claims.

What is claimed is:

1. A light-emitting diode device, comprising:
   a housing, having a front cover;
   at least one row of light-emitting diodes disposed in the housing and comprising a first transmitter and a first receiver, wherein the row of light-emitting diodes is operative to rotate about a central axis of the housing, and the light-emitting diodes are selectively activated in response to an orientation of the light-emitting diodes to generate an illumination pattern observable from the front cover; and
   a sound generating device disposed in the housing and comprising a second transmitter operative to generate a signal to the first receiver and a second receiver operative to receive a signal transmitted from the first transmitter, the sound-generating device being operative to generate a sound coordinated with the illumination pattern.

2. The light-emitting diode device of claim 1, wherein each of the light-emitting diodes comprises at least one light-emitting diode die.

3. The light-emitting diode device of claim 1, wherein each of the light-emitting diodes comprise one blue light-emitting diode die, one green light-emitting diode die and one red light-emitting diode die.

4. The light-emitting diode device of claim 1, wherein the row of light-emitting diodes is electrically connected to the sound generating device.

5. The light-emitting diode device of claim 1, wherein the row of light-emitting diodes is optically connected to the sound generating device.

6. The light-emitting diode device of claim 1, further comprising a third transmitter and a third receiver to interact with an external device.

7. The light-emitting diode device of claim 1, further comprising a light-emitting diode printed circuit board for supporting the row of light-emitting diodes.

8. The light-emitting diode device of claim 1, further comprising a main printed circuit board for controlling the sound generating device.

9. The light-emitting diode device of claim 1, further comprising a light-emitting guide installed between the front cover and the printed circuit board, wherein the light-emitting diodes are embedded and guided by the light-emitting diode guide.

10. The light-emitting diode device of claim 9, further comprising a spacer installed between the printed circuit board and the light-emitting diode guide for supporting the light-emitting diodes, wherein the spacer is configured to provide a substantially identical length of optical paths to the front cover for each of the light-emitting diodes.

11. The light-emitting diode device of claim 1, wherein the housing includes a circular dish.

12. The light-emitting diode device of claim 11, further comprising a supporting frame installed between the light-emitting diodes and the sound-generating device.

13. The light-emitting diode device of claim 1, further comprising a spinning mechanism driving the light-emitting diodes to rotate about the central axis.

14. The light-emitting diode device of claim 13, wherein the spinning mechanism comprises:
    a shaft member connected to the light-emitting diodes and extending along the central axis; and
    a motor for generating rotation of the shaft member.

15. The light-emitting diode device of claim 14, further comprising a cam member connected to the motor and the shaft member.

16. The light-emitting diode device of claim 13, further comprising a leaf switch actuated by the spinning mechanism for monitoring a spinning rate and orientation of the light-emitting diodes.

17. The light-emitting diode device of claim 13, further comprising at least one signal transmitter and a signal receiver which are periodically aligned with each other during rotation of the light-emitting diodes for monitoring a spinning rate and orientation of the light-emitting diodes.

18. The light-emitting diode device of claim 1, wherein the light-emitting diodes are installed on two rows crossing each other at the central axis.

19. The light-emitting diode device of claim 1, wherein the housing comprises a rectangular frame and a rear panel.

20. The light-emitting diode device of claim 19, wherein the sound-generating device is installed at a corner of the housing.

21. The light-emitting diode device of claim 1, wherein sound-generating device and the light-emitting diodes are interactive with each other by infrared transmitters and receivers.

22. A light-emitting diode device, comprising:
    a housing, having a front cover;
    at least one row of light-emitting diodes disposed in the housing, wherein the row of light-emitting diodes is operative to rotate about a central axis of the housing, and the light-emitting diodes are selectively activated in response to an orientation of the light-emitting diodes to generate an illumination pattern observable from the front cover;
    a spinning mechanism driving the light-emitting diodes to rotate about the central axis, the spinning mechanism comprising a shaft member connected to the light-emitting diodes and extending along the central axis, and a motor for generating rotation of the shaft member, the shaft member comprising:
        a conductive shaft connected to a first input terminal of the light-emitting diodes;
        an insulating bushing enclosing the conductive shaft therein; and
        a conductive bushing enclosing the insulating bushing therein, the conductive bushing being connected to a second input terminal of the light-emitting diodes;
    a sound generating device disposed in the housing, the sound-generating device being operative to generate a sound coordinated with the illumination pattern.

23. The light-emitting diode device of claim 22, wherein the conductive shaft and the conductive bushing are connected to output terminals of a power supply.

24. A light-emitting diode device, comprising:
    a light-generating device, comprising:
        at least one row of light-emitting diodes operative to rotate about a central axis, wherein the light-emitting diodes are selectively switched on or off at an orientation to generate a predetermined illumination pattern; and
        a first transmitter and a first receiver, the first transmitter being operative to transmit a first activation signal carrying information of the illumination pattern;
    a sound-generating device, comprising:
        a speaker, the speaker being operative to generate a sound in response to the first activation signal; and
        a second transmitter and a second receiver, wherein the second receiver is operative to receive the first activation signal to activate the speaker, and the second transmitter is operative to transmit a second activation signal carrying information of the sound to the first receiver.

25. The light-emitting diode device of claim 24, wherein the light-generating device and the sound-generating device are each disposed in a common housing.

26. The light-emitting diode device of claim 24, wherein the light-generating device and the sound-generating device are disposed in separate housings.

* * * * *